US006043553A

United States Patent [19]

Suzuki

[11] Patent Number: 6,043,553

[45] Date of Patent: Mar. 28, 2000

[54] MULTI-EMITTER BIPOLAR TRANSISTOR OF A SELF-ALIGN TYPE

[75] Inventor: Hisamitsu Suzuki, Tokyo, Japan

[73] Assignee: NEC Corporation, Tokyo, Japan

[21] Appl. No.: 09/288,089

[22] Filed: Apr. 8, 1999

[30] Foreign Application Priority Data

Apr. 16, 1998 [JP] Japan .................................. 10-105926

[51] Int. Cl.[7] ........................ H01L 27/082; H01L 27/102; H01L 29/70; H01L 31/11

[52] U.S. Cl. ........................... 257/587; 257/584; 257/588

[58] Field of Search .................................... 257/565, 584, 257/587, 588

[56] References Cited

U.S. PATENT DOCUMENTS

| | | | |
|---|---|---|---|
| 5,539,243 | 7/1996 | Matsuki | 257/584 |
| 5,629,554 | 5/1997 | Maas et al. | 257/586 |
| 5,719,432 | 2/1998 | Kariyazono et al. | 257/565 |

OTHER PUBLICATIONS

Itoh, et. al. "Optimization of shallow and deep trench isolation structures for ultra–high–speed bipolar LSIs", IEEE 1992 Bipolar Circuits and Technology Meeting 4.7, pp. 104–107.

*Primary Examiner*—Ngân V. Ngô
*Attorney, Agent, or Firm*—McGinn & Gibb, P.C.

[57] ABSTRACT

To provide a semiconductor device including a self-align type multi-emitter bipolar transistor wherein every collector-base isolation length can be reduced into a minimum value allowed in connection with the collector-base breakdown voltage, in a self-align type bipolar transistor having a multi-emitter structure, more than one emitter/base formation regions (114 and 115) and at least one collector leading region (106) are arranged in a single array, and extrinsic base regions (114) are connected to at least one base electrode (119*c*) having a contact plug (118*c*) provided outside the single array by way of a base leading electrode (109). Therefore, collector-base isolation lengths can be set to be a minimum length (e) determined by a collector-base breakdown voltage, enabling to minimize the collector resistance, the collector-base capacitance and the collector-substrate capacitance, as well as to minimize the element size of the bipolar transistor.

9 Claims, 13 Drawing Sheets

MULTI-EMITTER BIPOLAR TRANSISTOR OF A SELF-ALIGN TYPE

BACKGROUND OF THE INVENTION

The present invention relates to a semiconductor device including a bipolar transistor, and particularly to a structure of a semiconductor device including a multi-emitter bipolar transistor of a self-align type.

Along with remarkable development of mobile communication equipment such as a mobile telephone or a PHS (Personal Handy-phone System) or computer networks, high-performance and inexpensive bipolar transistors are earnestly pursued for realizing high-speed and low-cost communication circuits.

An promising approach is application of a self-align type bipolar transistor having emitter and base leading electrodes formed of poly-Si (poly-crystalline silicon) such as described in "Optimization of shallow and deep trench isolation structures for ultra-high-speed bipolar LSIs" by Itoh et al., pp. 104–107, proceedings IEEE 1992 Bipolar Circuits and Technology Meeting.

FIG. 11A illustrates a plan layout of a conventional example (here-after called the first conventional example) of a bipolar transistor of this type, whereof a sectional view cut along a line F–F' of FIG. 11A is illustrated in FIG. 11B.

In the first conventional example of FIGS. 11A and 11B, an $n^+$-type buried layer 202 is selectively formed on a p-type Si substrate 201 and an n-type epitaxial layer 203 is formed thereon, to configure a bipolar transistor in a region surrounded by a first element-isolation film 204.

An extrinsic base region 213, an intrinsic base region 214, and a collector leading region 206 for leading out the $n^+$-type buried layer 202 are formed in a region surrounded by a second element-isolation film 205. The extrinsic base region 213 is led out by a base leading electrode 209 made of poly-Si, and an emitter region 215 is led out by an emitter leading electrode 212 also made of poly-Si. The base leading electrode 209 and the emitter leading electrode 212 are isolated from each other by a first and a second insulation film 210 and 211. The collector leading region 206, the emitter leading electrode 212 and the base leading electrode 209 are connected to a collector wiring 219*a*, an emitter wiring 219*b* and a base wiring 219*c*, respectively, through respective one of contact plugs 218*a*, 218*b* and 218*c* which are formed penetrating through an inter-layer insulation film 217.

In FIG. 11B, the base diffusion width a, the collector-base isolation length b and the separation length c between two wirings are designed to be respective minimum values which process factors allow.

The above structure of the self-align type bipolar transistor is determined in consideration of following factors.

1) It is generally effective for performance improvement of a bipolar transistor to minimize an area size of its emitter/base formation region. For this purpose, the base diffusion width a of FIG. 11B should be made as narrow as possible for minimizing the size of the emitter/base formation region 208.

2) The collector-base isolation length b of FIG. 11B should be as small as possible for reducing parasitic capacitance of the bipolar transistor, provided that it is longer than an isolation length determined from the collector-base breakdown voltage, and usually designed to be a minimum value allowed by the process factors.

3) The wiring width of the emitter and the collector electrode should be as wide as possible, for improving wiring reliability of the self-align type bipolar transistor wherein on-current of several mA to several 10 mA flows.

It is from these reasons that the contact plug 218*c* of the base wiring 219*c* cannot be formed directly upon the extrinsic base region 213, when the separation between the emitter wiring 219*b* and the base wiring 219*c* is set to have the minimum length c, and should be positioned on the second element-isolation film 205 to be connected indirectly to the extrinsic base region 213 by way of the base leading electrode 209 formed along the surface of the second-element isolation film 205.

For improving high-frequency performance of the self-align type bipolar transistor, the maximum oscillation frequency fmax should be made high and the maximum oscillation frequency fmax is in inverse proportion to the base resistance. Therefore, a structure having two base electrodes at both sides of the emitter electrode is often applied for reducing the base resistance, instead of the basic structure having one electrode for each of the emitter, the collector and the base as illustrated in FIGS. 11A and 11B. Furthermore, a multi-emitter structure having more than one emitter/base formation regions is sometimes applied for increasing current capacity of the self-align type bipolar transistor.

As a second conventional example, a self-align type bipolar transistor having a multi-emitter structure provided with base electrodes ranged at both sides of each emitter is briefly described referring to FIGS. 12A and 12B. FIG. 12A illustrates a plan layout of the multi-emitter bipolar transistor of the second conventional example, whereof a sectional view cut along a line G–G' is illustrated in FIG. 12B.

As shown in FIG. 12A, the contact holes for emitter, collector and base electrodes are arranged in an order of collector-base-emitter-base-collector-base-emitter-base-collector form left to right of the line G–G', and the contact plugs 218*a*, 218*b* and 218*c* of the respective electrodes are aligned straight.

Each element of the second conventional example of FIG. 12B is formed in a similar way with the corresponding element of the first conventional example of FIGS. 11A and 11B. However, the collector-base isolation length d of the second element-isolation film 205 is forced to be wider in FIG. 12B than the collector-base isolation length b of FIG. 11B, because of base wirings 219*c* each provided between a collector wiring 219*a* and an emitter wiring 219*b* provided upon the second element-isolation film 205 for reducing the base resistance, which were not provided there in the first conventional example of FIG. 11B.

Now, another example of the multi-emitter bipolar transistor is briefly described as a third conventional example referring to FIGS. 13A and 13B. FIG. 13A illustrates a plan layout of the multi-emitter bipolar transistor according to the third conventional example, and FIG. 13B is a sectional view cut along a line H–H' of FIG. 13A.

The structure of the third conventional example of FIGS. 13A and 13B, wherein the central collector wiring and corresponding elements of the second conventional example of FIGS. 12A and 12B are omitted, is to be applied in a circuit where the collector resistance is not required to be so low, and a collector, a base, an emitter, a base, an emitter and a collector are arranged in this order from left to right of FIG. 13A.

Here also, the contact plugs 218*a*, 218*b* and 218*c* of the respective electrodes are aligned straight.

As the number of collector electrodes is reduced from three to two, the whole size of the multi-emitter bipolar transistor can be made smaller according to the third conventional example than the second conventional example. However, when each individual element has the same size, the collector-base isolation length d of FIG. 13B is the same to the collector-base isolation length d of FIG. 12B, remaining wider than the collector-base isolation length b of FIG. 11B.

As heretofore described, the multi-emitter structure is applied for improving transistor characteristics of the self-align type bipolar transistor. However, the multi-emitter structure of the self-align type bipolar transistor is conventionally accompanied with a problem that the collector-base isolation length d is forced to be wider as illustrated in FIGS. 12A and 12B or in FIGS. 13A and 13B than the minimum value b of the collector-base isolation length which can be achieved in the basic structure as illustrated in FIGS. 11A and 11B wherein only one electrode is provided for each of the emitter, the collector and the base.

This problem results in not only obstruction of high-integration and miniaturization of semiconductor integrated circuits but also degradation of high-frequency performance of the bipolar transistor, due to increase of collector resistance, collector-base capacitance and collector-substrate capacitance of the bipolar transistor.

SUMMARY OF THE INVENTION

Therefore, a primary object of the present invention is to resolve the above problem and provide a semiconductor device including a self-align type multi-emitter bipolar transistor wherein every collector-base isolation length can be reduced into a minimum value allowed in connection with the collector-base breakdown voltage.

In order to achieve the object, in a self-align type bipolar transistor having a multi-emitter structure included in a semiconductor device according to the invention, more than one emitter/base formation regions and at least one collector leading region are arranged in a single array, and extrinsic base regions are connected to at least one base electrode having a contact plug provided outside the single array by way of a base leading electrode.

Therefore, collector-base isolation lengths can be set to be a minimum length determined by the collector-base breakdown voltage, enabling to minimize the collector resistance, the collector-base capacitance and the collector-substrate capacitance, as well as to minimize the element size of the bipolar transistor.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1A:
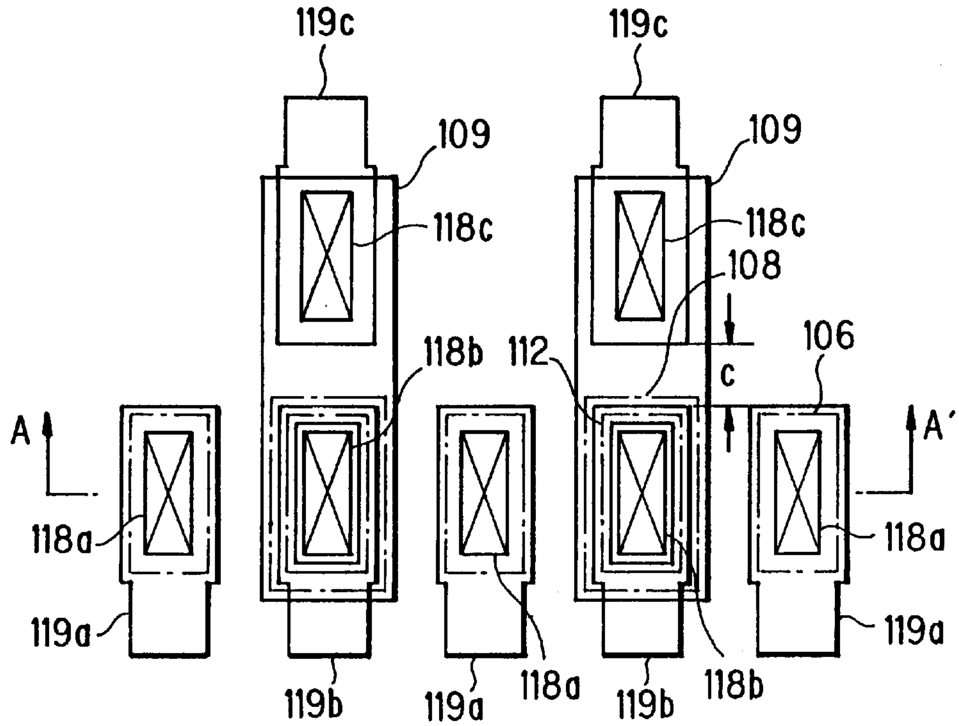
FIG. 1A shows a plan layout of a multi-emitter bipolar transistor according to a first embodiment of the invention.
Figure 1B:
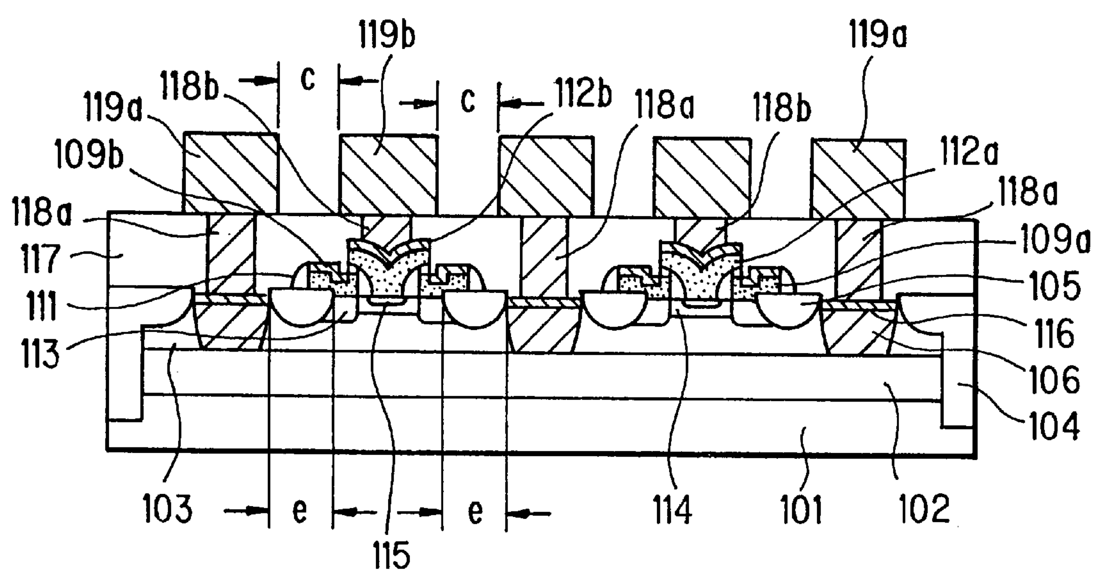
FIG. 1B is a sectional view of the multi-emitter bipolar transistor of FIG. 1A cut along a line A–A'.

FIG. 1A shows a plan layout of a multi-emitter bipolar transistor according to a first embodiment of the invention, and FIG. 1B is a sectional view thereof cut along a line A–A' of FIG. 1A.

In the first embodiment, contact plugs 118*a* for collectors and contact plugs 118*b* for emitters are arranged alternately in an order of collector-emitter-collector-emitter-collector, from left to right on the line A–A' of FIG. 1A, and contact plugs 118*c* for bases are not arranged on the line A–A'. For each of the emitter contact plugs 118*b*, one base contact plug 118*c* is provided so that a line passing through centers of the base contact plug 118*c* and the emitter contact plug 118*b* falls at right angles with the line A—A', that is, a line passing through centers of two collector contact plugs 118*a* adjoining to the emitter contact plug 118*b*, both the separation between a collector wiring 119*a* and the emitter wiring 119*b* and the separation between the base wiring 119*c* and the emitter wiring 119*b* being set to be the minimum length c defined by the process factors as previously described.

In the first embodiment, each emitter leading electrode 112 is composed of a 2-layer film comprising an emitter leading poly-Si layer 112*a* and an emitter leading silicide layer 112*b*, and a main part of each base leading electrode 109 is also composed of a 2-layer film comprising a base leading poly-Si layer 109*a* and a base leading silicide layer 109*b*, as shown in FIG. 1B. Similarly, on each collector leading region 106, a collector leading silicide layer 116 is formed. For these emitter, base and collector silicide layers 112*b*, 109*b* and 116, silicide of Ti or Co is applied.

Figure 11A:
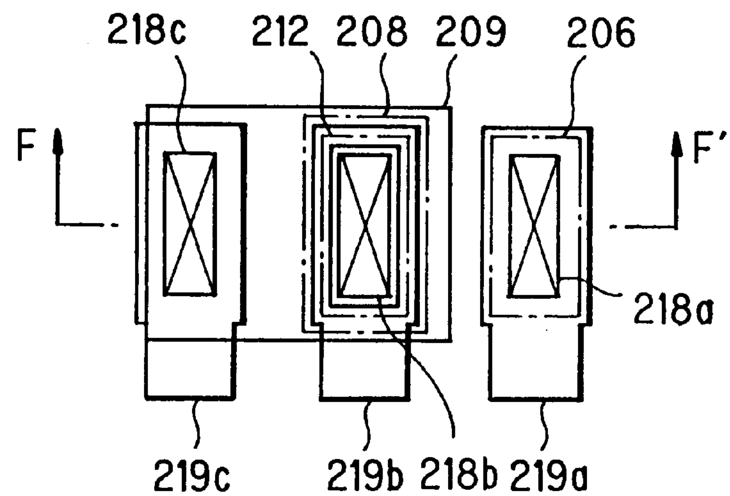
FIG. 11A illustrates a plan layout of a first conventional example of a bipolar transistor of a self-align type.
Figure 11B:
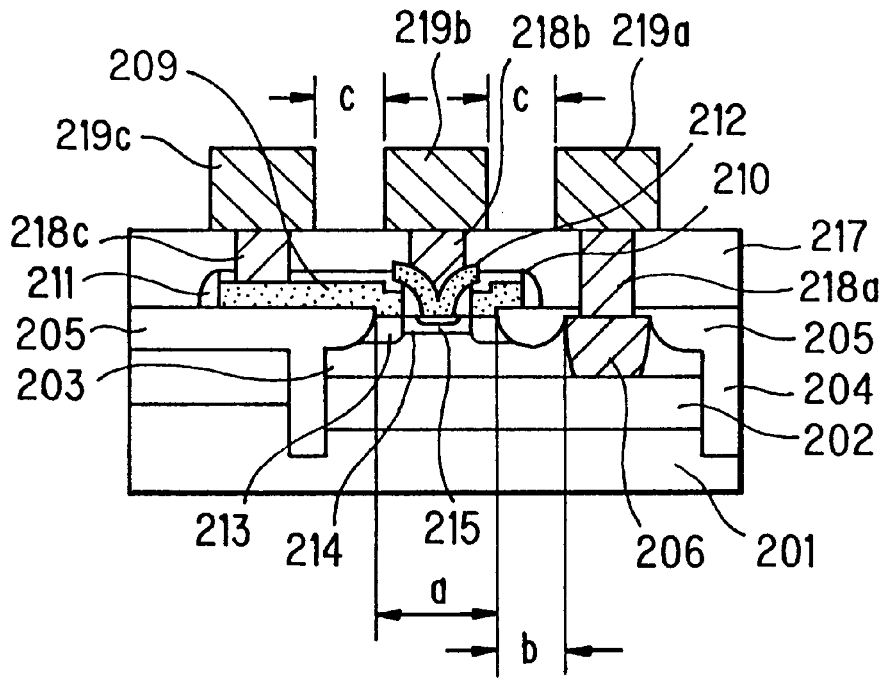
FIG. 11B is a sectional view of the bipolar transistor of FIG. 11A cut along a line F–F'.

Here, it should be noted that the collector-base isolation length e can be minimized in the first embodiment to be the same with the collector-base isolation length b of the first conventional example of FIG. 11B, since no base wiring is provided upon the second element isolation film 105 between any pair of a collector wiring 119*a* and an emitter wiring 119*b* arranged along the line A–A'.

Now, fabrication processes of the multi-emitter bipolar transistor of the first embodiment will be described referring to FIGS. 2A to 3B.

Figure 2A:
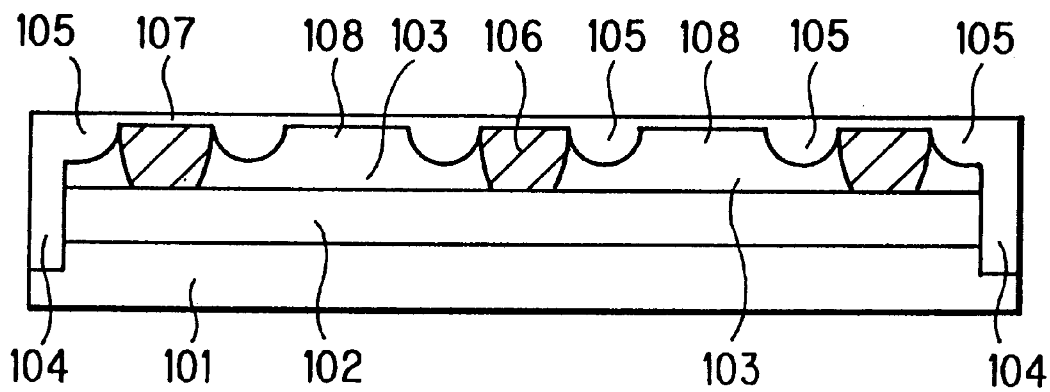
FIG. 2A is a sectional view for illustrating fabrication processes of the multi-emitter bipolar transistor of FIG. 1A.

Referring to FIG. 2A, an n+ buried layer 102 is first formed selectively on a p-type Si substrate 101 making use of a mask, whereon an n-type epitaxial layer 103 of 0.4 μm to several μm thickness is grown. Then, wide and shallow trenches are formed so as not to attain to the $n^+$ buried layer 102, for dividing emitter/base formation regions 108 and collector leading region 106 to be formed. Then, narrow and deep trenches of 0.4 μm to 2 μm width are formed so as to penetrate through the $n^+$ buried layer 102 for sectioning a transistor formation region. By entirely filling the shallow and the deep trenches with insulation material such as an oxide film, a first and a second element-isolation film 104 and 105 are formed. Then, a first insulation film 107 of 5 to 30 nm thickness is formed by way of a thermal-oxidation method, for example, and the collector leading regions 106 doped into $n^+$-type are formed making use of selective ion-implantation technology.

Figure 2B:
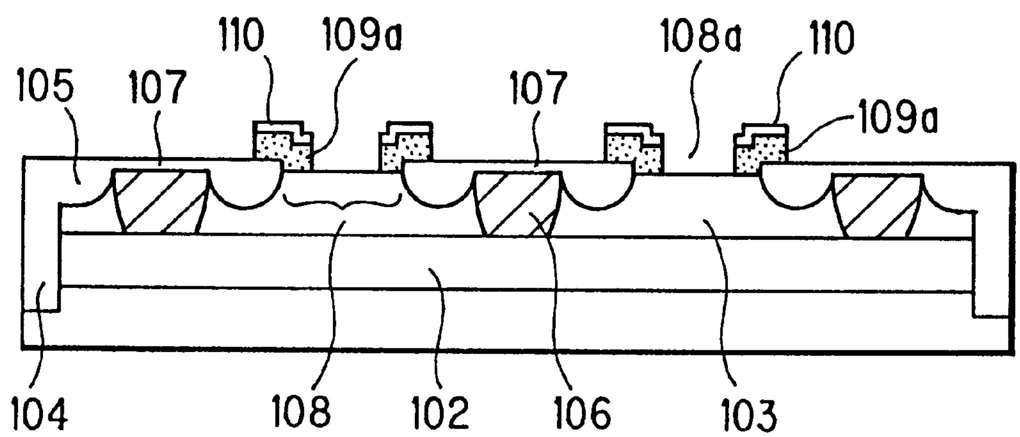
FIG. 2B is another sectional view for illustrating fabrication processes of the multi-emitter bipolar transistor of FIG. 1A.

Then, as shown in FIG. 2B, after partially removing the first insulation film 107 on the emitter/base formation regions 108 making use a photo-resist mask, for example, a poly-Si films having 10 to 40 nm thickness and doped into p-type are formed overall, through growth and ion-implantation or through deposition making use of a growth vapor added with impurities. Then, after covering the poly-Si film with a second insulation film 110 formed with an oxide or nitride film of 5 to 20 nm, the poly-Si film is masked with photo-resist, for example, and etched back through anisotropic etching in order to form the base leading poly-Si layers 109*a* each having an emitter opening 108*a* at its center part.

Figure 3A:
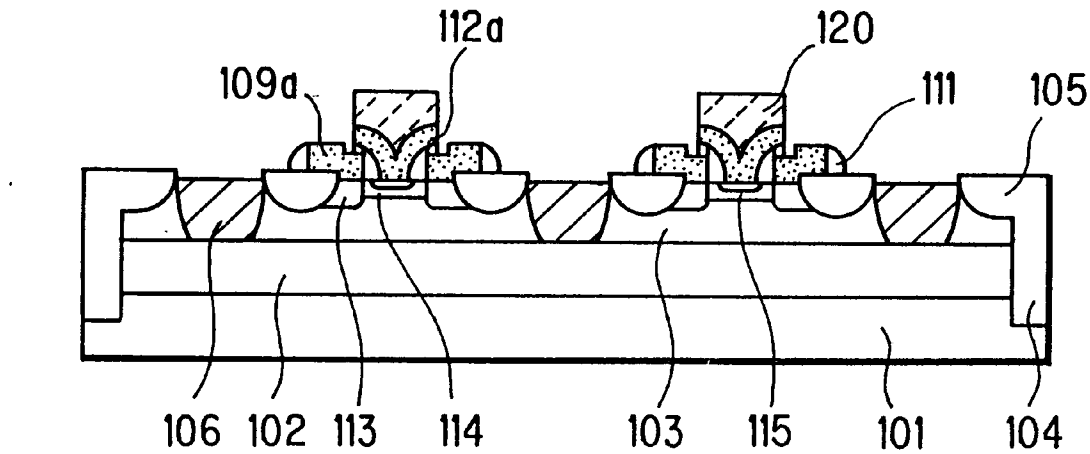
FIG. 3A is another sectional view for illustrating fabrication processes of the multi-emitter bipolar transistor of FIG. 1A.

Then, as shown in FIG. 3A, intrinsic and extrinsic base regions 114 and 113 are formed through ion-implantation of B or $BF_2$, or introduction of impurities through thermal diffusion from a gas. After forming the intrinsic base regions 114, a third insulation film 111 is formed and etched back by anisotropic etching for configuring side walls along side surfaces of the base leading poly-Si layers 109*a*. Then, $n^+$ doped poly-Si film of 10 to 40 nm is formed through growth and ion-implantation, or deposition making use of a growth gas including impurities, which is masked with a photo-resist pattern 120 and processed by anisotropic etching for forming emitter leading poly-Si layers 112*a*. Then, the first insulation film 107 on the collector leading regions 106 is selectively removed by anisotropic etching using a photo-resist mask.

Figure 3B:
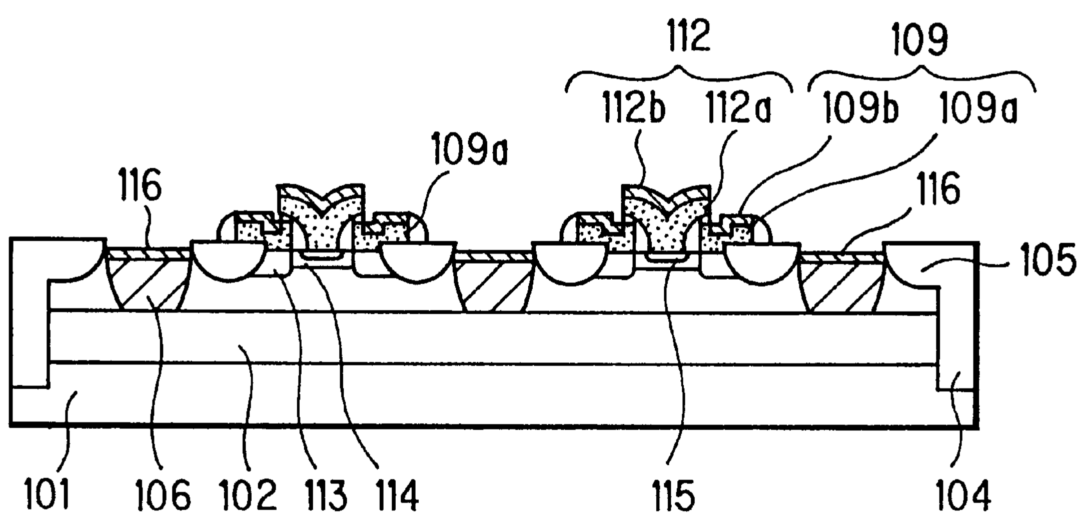
FIG. 3B is still another sectional view for illustrating fabrication processes of the multi-emitter bipolar transistor of FIG. 1A.

Then, as shown in FIG. 3B, Ti or Co of 10 to 50 nm thickness is depositted by sputtering, for example, and made to react with Si in a nitrogen or argon-nitrogen atmosphere into a silicide film, whereof useless parts are removed for forming base leading silicide layers 109*b*, collector leading silicide layers 116 and emitter leading silicide layers 112*b* on surfaces of the base leading poly-Si layers 109*a*, collector leading regions 106 and the emitter leading poly-Si layers 112*a*, respectively.

Then, an inter-layer insulation film 117 having a lamination of an oxide film and another oxide film including B and P is formed and contact plugs 118*a* to 118*c* including barrier metal are formed after digging contact holes at necessary positions of the inter-layer insulation film 117. Finally, a metal film of Al or Cu is formed and patterned by anisotropic etching for providing collector wirings 119*a*, emitter wirings 119*b* and base wirings 119*c*.

Thus, the multi-emitter bipolar transistor of FIGS. 1A and 1B is fabricated according to the first embodiment.

Figure 4A:
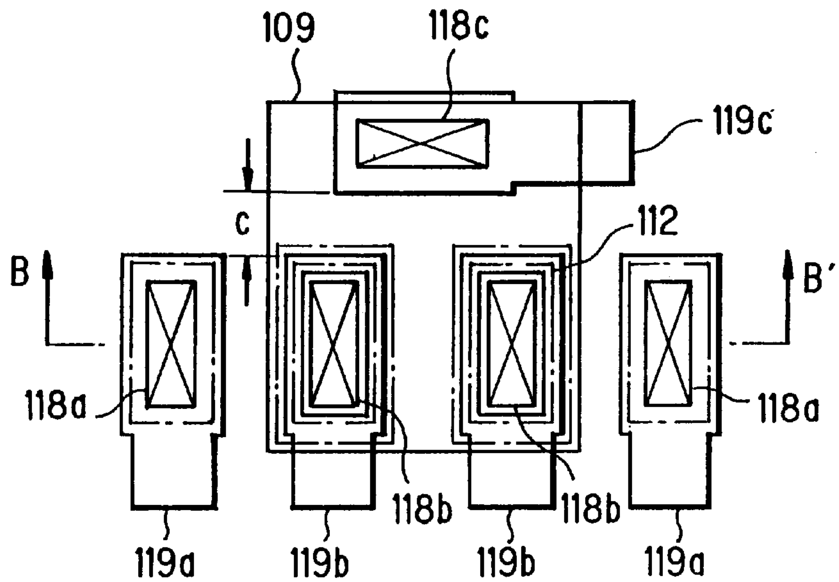
FIG. 4A shows a plan layout of a multi-emitter bipolar transistor according to a second embodiment of the invention.
Figure 4B:
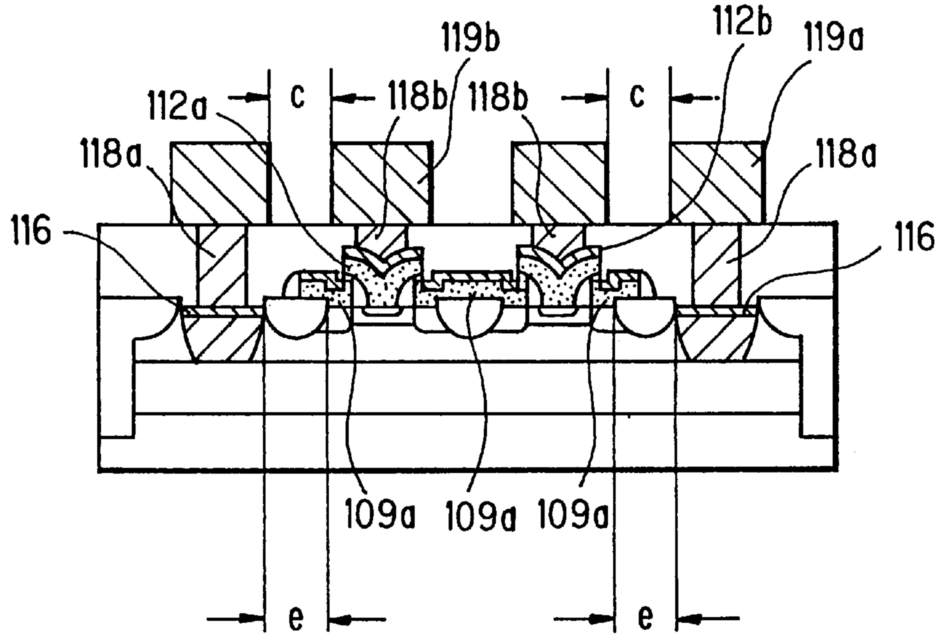
FIG. 4B is a sectional view of the multi-emitter bipolar transistor of FIG. 4A cut along a line B–B'.

FIG. 4A shows a plan layout of a multi-emitter bipolar transistor according to a second embodiment of the invention, and FIG. 4B is a sectional view thereof cut along a line B–B' of FIG. 4A.

A difference of the second embodiment from the first embodiment shown in FIGS. 1A to 3B lies in that the center collector electrode provided in the first embodiment between the two emitter electrodes is eliminated and the two base leading electrodes 109 and their wirings 119*c* of the first embodiment are united into one base leading electrode 109 and one base wiring 119*c* in the second embodiment. The structure according to the second embodiment is preferably applied where a little increase of collector resistance can be allowed, for enabling further reduction of the base resistance, the collector-base capacitance and the collector-substrate capacitance.

As a modification of the second embodiment, the two outer side collector electrodes of FIGS. 1A to 3B may be eliminated leaving the center collector electrode as it is, in turn, when further increase of the collector resistance is permissible. In this case too, it is preferable to form a base leading electrode from a single conductive film covering the transistor region to have two openings surrounding two emitter/base formation regions in contact with the extrinsic base regions and an opening surrounding the collector leading region with necessary isolation lengths.

Figure 5A:
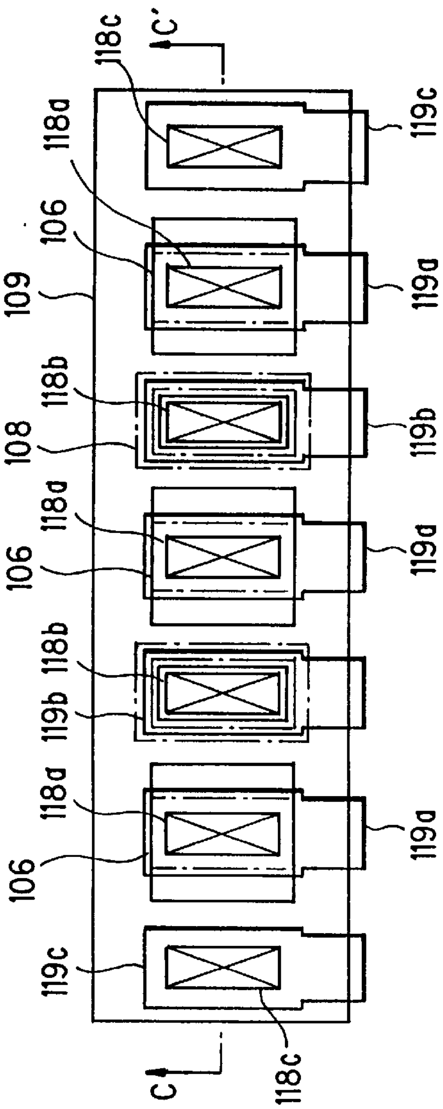
FIG. 5A illustrates a plan layout of a multi-emitter bipolar transistor according to a third embodiment of the invention.
Figure 5B:
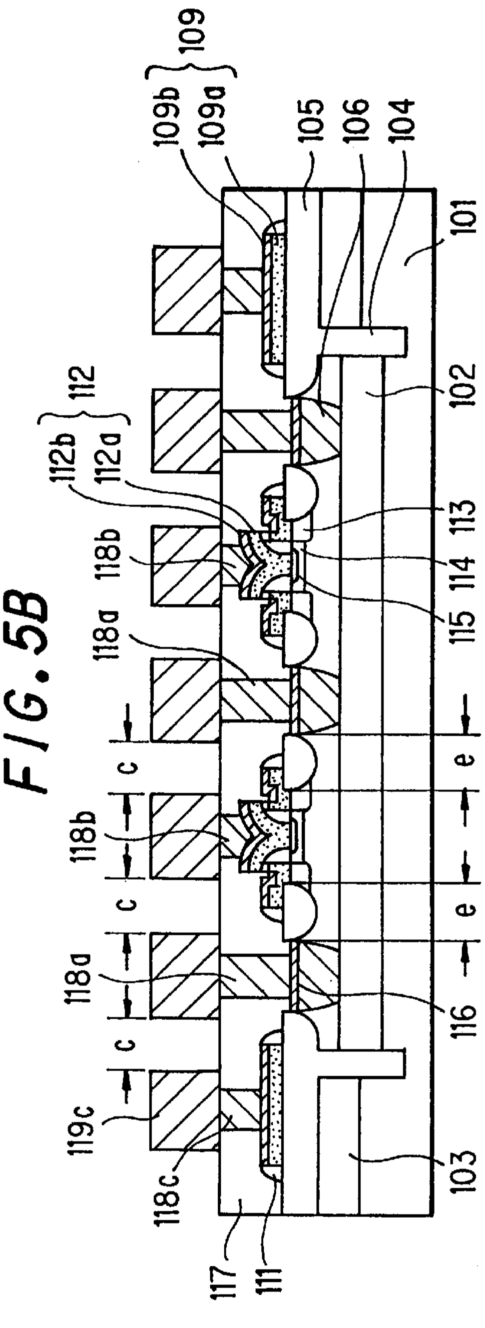
FIG. 5B is a sectional view of the multi-emitter bipolar transistor of FIG. 5A cut along a line C–C'.

FIG. 5A illustrates a plan layout of a multi-emitter bipolar transistor according to a third embodiment of the invention, whereof a sectional view cut along a line C–C' is shown in FIG. 5B.

In the third embodiment, collector contact plugs 118*a* and emitter contact plugs 118*b* are arranged straight in a single array, and two base contact plugs 118*c* are provided adjoining to both ends of the array, as shown in FIG. 5A.

In the plan layout of FIG. 1A of the first embodiment, the base wirings 119*c* are connected to the base leading electrodes 109 through the base contact plugs 118*c* provided at one side of the array of the emitter and the collector contact plugs 118*a* and 118*b*. Therefore, potential drops may occur at farthest edges of the extrinsic base regions 113 from the base contact plugs 118*c*, when emitter length is increased in a direction perpendicular to the line A–A', even though resistivity of the silicide layer 116 is very low.

In the third embodiment, the two base contact plugs 118*c* are provided at both ends of the array of the collector and the emitter contact plugs 118*a* and 118*b*, in an order of base-collector-emitter-collector-emitter-collector-base, such as shown in FIG. 5A, from left to right of the line C–C', for resolving the above problem.

In the third embodiment, the collector-base isolation length e can be also minimized to be the same with the collector-base isolation length b of the first conventional example of FIG. 11B.

Now, fabrication processes of the multi-emitter bipolar transistor of the third embodiment is described referring to FIGS. 6A to 7B.

Figure 6A:
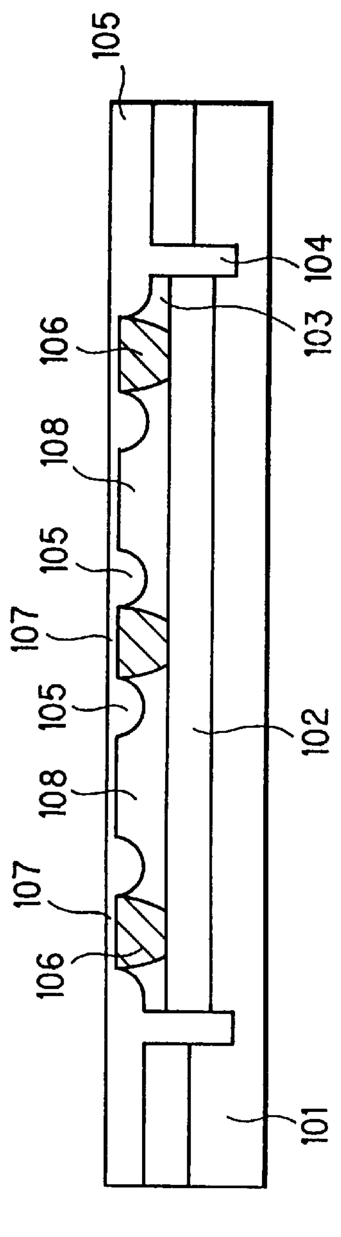
FIG. 6A is a sectional view for illustrating fabrication processes of the multi-emitter bipolar transistor of FIG. 5A.

As shown in FIG. 6A, an $n^+$ buried layer 102 is first formed selectively on a p-type Si substrate 101 making use of a mask, whereon an n-type epitaxial layer 103 of 0.4 $\mu$m to several $\mu$m thickness is grown. Then, wide and shallow trenches are formed so as not to attain to the $n^+$ buried layer 102, for dividing emitter/base formation regions 108 and collector leading region 106 to be formed. Then, narrow and deep trenches of 0.4 $\mu$m to 2 $\mu$m width are formed so as to penetrate through the $n^+$ buried layer 102 for sectioning a transistor formation region. By entirely filling the shallow and the deep trenches with insulation material such as an oxide film, a first and a second element-isolation film 104 and 105 are formed. Then, a first insulation film 107 of 5 to 30 nm thickness is formed by way of a thermal-oxidation method, for example, and the collector leading regions 106 doped into $n^+$-type are formed making use of selective ion-implantation technology.

Figure 6B:
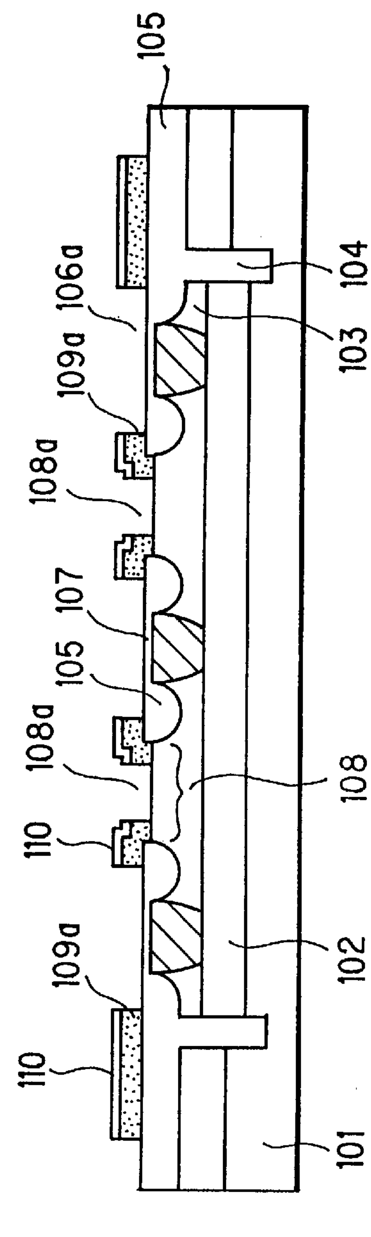
FIG. 6B is another sectional view for illustrating fabrication processes of the multi-emitter bipolar transistor of FIG. 5A.

Then, as shown in FIG. 6B, after partially removing the first insulation film 107 on the emitter/base formation regions 108 making use a photo-resist mask, for example, a poly-Si films having 10 to 40 nm thickness and doped into p-type are formed overall, through growth and ion-implantation or through deposition making use of a growth vapor added with impurities. Then, after covering the poly-Si film with a second insulation film 110 formed with an oxide or nitride film of 5 to 20 nm, the poly-Si film is masked with photo-resist, for example, and etched back through anisotropic etching in order to from a base leading poly-Si layer 109*a* having emitter openings 108*a* and collector openings 106*a* at its inner part.

Figure 7A:
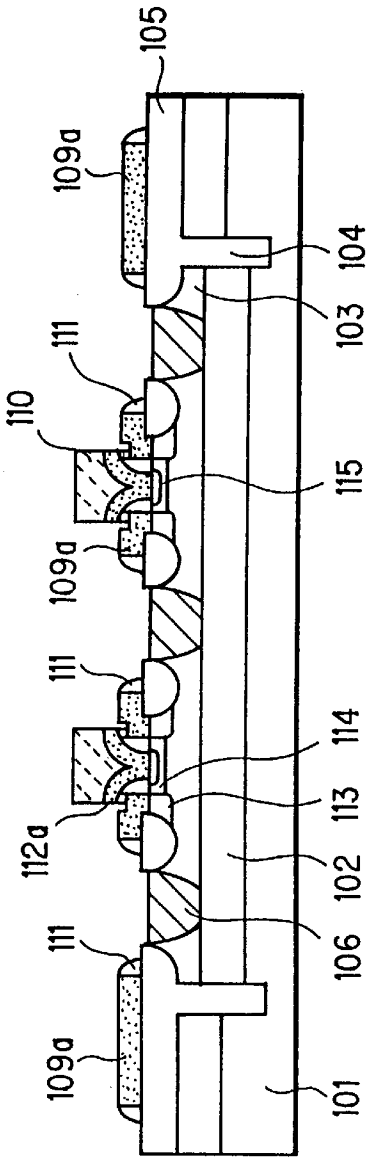
FIG. 7A is another sectional view for illustrating fabrication processes of the multi-emitter bipolar transistor of FIG. 5A.

Then, as shown in FIG. 7A, intrinsic and extrinsic base regions 114 and 113 are formed through ion-implantation of B or $BF_2$, or introduction of impurities through thermal diffusion from a gas. After forming the intrinsic base regions 114, at third insulation film 111 is formed and etched back by anisotropic etching for configuring side walls along inner side surfaces of the base leading poly-Si layer 109*a*. Then, $n^+$ doped poly-Si film of 10 to 40 nm is formed through growth and ion-implantation, or deposition making use of a growth gas including impurities, which is masked with a photo-resist pattern 120 and processed by anisotropic etching for forming emitter leading poly-Si layers 112*a*. Then, the first insulation film 107 on the collector leading regions 106 is selectively removed by anisotropic etching using a photo-resist mask.

Figure 7B:
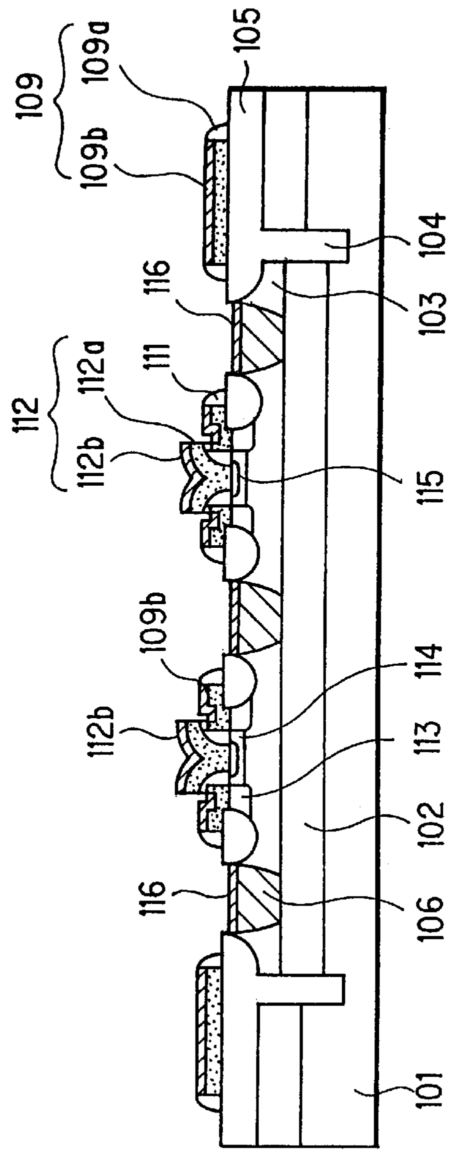
FIG. 7B is still another sectional view for illustrating fabrication processes of the multi-emitter bipolar transistor of FIG. 5A.

Then, as shown in FIG. 7B, Ti or Co of 10 to 50 nm thickness is depositted by sputtering, for example, and made to react with Si in a nitrogen or argon-nitrogen atmosphere into a silicide film, whereof useless parts are removed for forming a base leading silicide layer 109*b*, collector leading silicide layers 116 and emitter leading silicide layers 112*b* on surfaces of the base leading poly-Si layer 109*a*, collector leading regions 106 and the emitter leading poly-Si layers 112*a*, respectively.

Then, an inter-layer insulation film 117 having a lamination of an oxide film and another oxide film including B and P is formed and contact plugs 118*a* to 118*c* including barrier metal are formed after digging contact holes at necessary positions of the inter-layer insulation film 117. Finally, a metal film of Al or Cu is formed and patterned by anisotropic etching for providing collector wirings 119*a*, emitter wirings 119*b* and base wirings 119*c*.

Thus, the multi-emitter bipolar transistor of FIGS. 5A and 5B of the third embodiment is fabricated in the same way with the first embodiment.

Figure 8A:
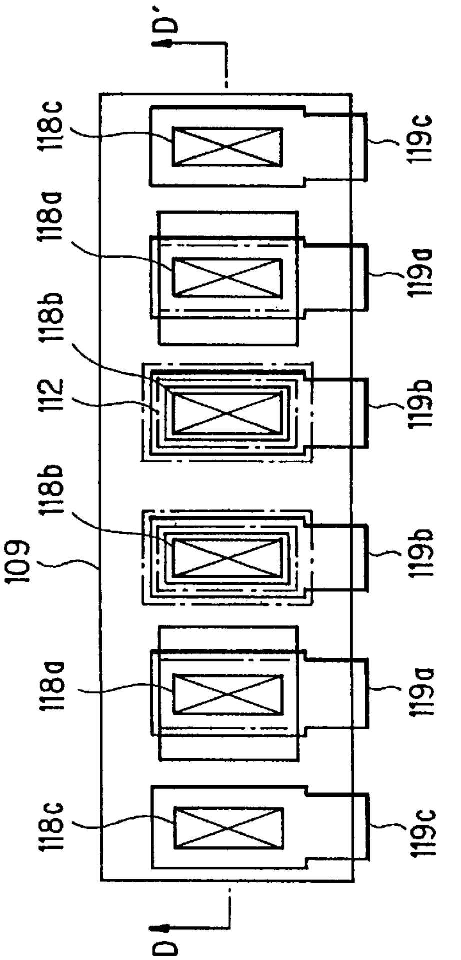
FIG. 8A shows a plan layout of a multi-emitter bipolar transistor according to a fourth embodiment of the invention.
Figure 8B:
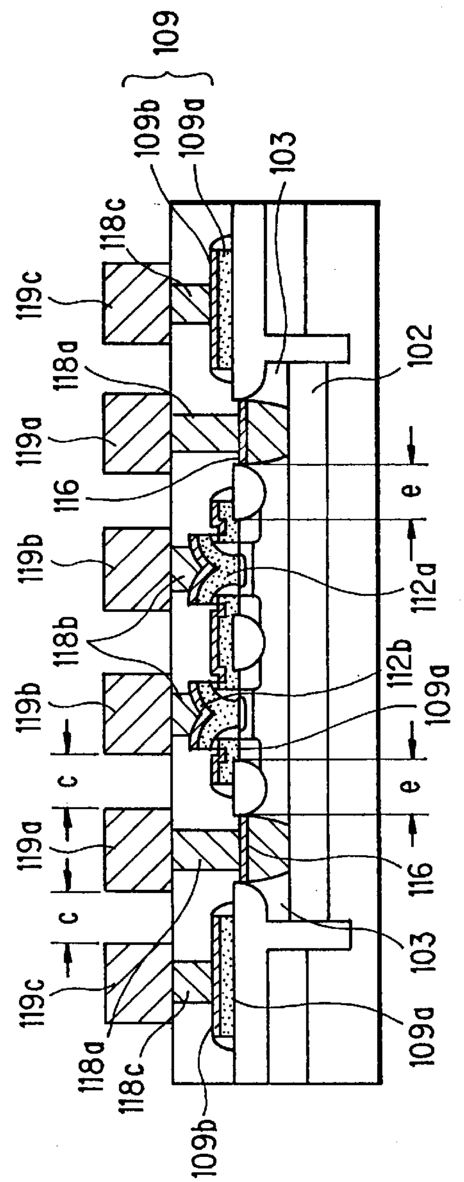
FIG. 8B is a sectional view of the multi-emitter bipolar transistor of FIG. 8A cut along a line D–D'.

FIG. 8A shows a plan layout of a multi-emitter bipolar transistor according to a fourth embodiment of the invention, and FIG. 8B is a sectional view thereof cut along a line D–D' of FIG. 8A.

A difference of the fourth embodiment from the third embodiment shown in FIGS. 5A to 7C lies in that the center collector electrode provided in the first embodiment between the two emitter electrodes is eliminated. The structure according to the fourth embodiment is preferably applied where a little increase of collector resistance can be allowed, for enabling further reduction of the base resistance, the collector-base capacitance and the collector-substrate capacitance.

As a modification of the fourth embodiment, the two outer side collector electrodes of FIGS. 5A to 7B may be eliminated leaving the center collector electrode as it is, when further increase of the collector resistance is permissible, for further reducing the base resistance, the collector-base capacitance and the collector-substrate capacitance.

Furthermore, the number of the base contact plugs 118*c* may be reduced to one by eliminating either of the two base wirings 119*c*, when resistivity of the base leading electrode can be made sufficiently low.

Now, a multi-emitter bipolar transistor according to a fifth embodiment of the invention will be described referring to FIGS. 9A to 10B.

Figure 9A:
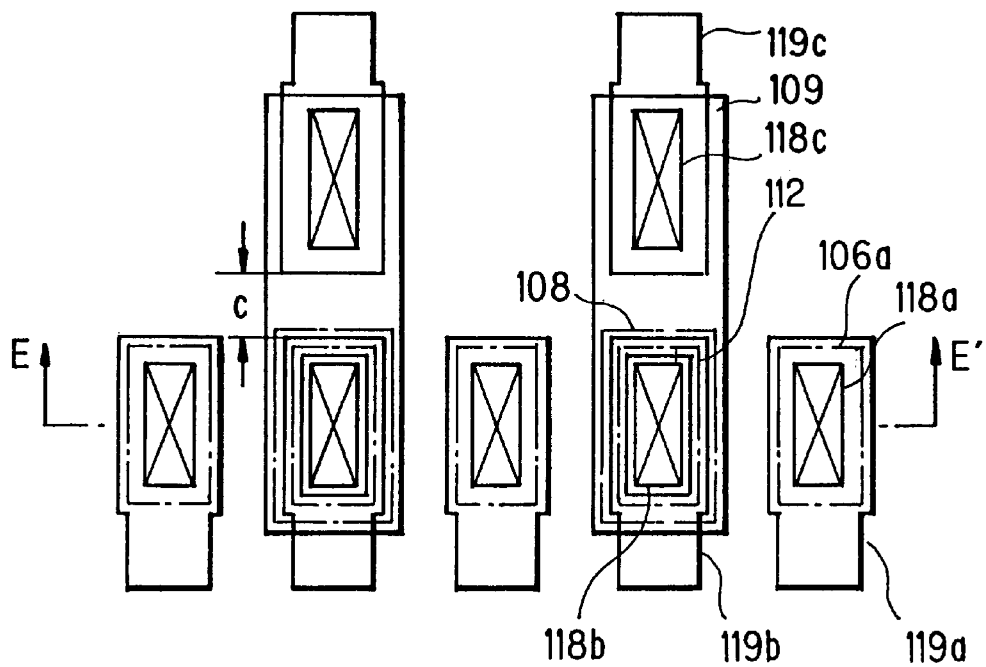
FIG. 9A is a sectional view for illustrating fabrication processes of the multi-emitter bipolar transistor of FIG. 8A.
Figure 9B:
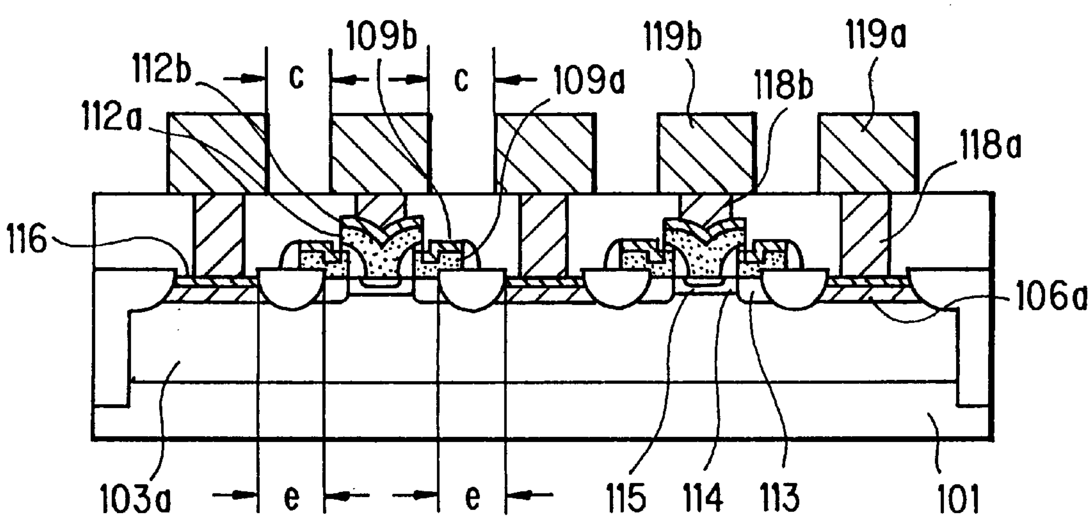
FIG. 9B is another sectional view for illustrating fabrication processes of the multi-emitter bipolar transistor of FIG. 8A.

The multi-emitter bipolar transistor of the fifth embodiment of FIG. 9A has a similar structure to the multi-emitter bipolar transistor of FIG. 1A according to the first embodiment. A difference of the fifth embodiment to the first embodiment is that the collector region composed of the $n^+$-type buried layer 102 and the n-type epitaxial layer 103 of the first embodiment is replaced with a single collector region 103*a* formed by ion-implantation as illustrated in FIG. 9B, and accordingly, there are formed collector leading regions 106*a* which are shallower than the collector leading regions 106 formed to contact with the $n^+$-type buried layer 102 in the first embodiment.

Recently, a technology to form collector regions directly on a p-type Si substrate by ion-implanting n-type impurities has become to be used for reducing the process cost. In the fifth embodiment, this technology is applied. According to this technology, there is formed no $n^+$-type buried layer, and therefore, collector resistance should inevitably become very high upto the order of 100 to 500 Ω, when a base contact plug is formed between the emitter and the collector contact plugs such as the second conventional example of FIGS. 12A and 12B.

This increase of collector resistance can be suppressed according to the fifth embodiment wherein the collector-base isolation length e can be set into the minimum isolation length b of FIG. 11B.

Figure 10A:
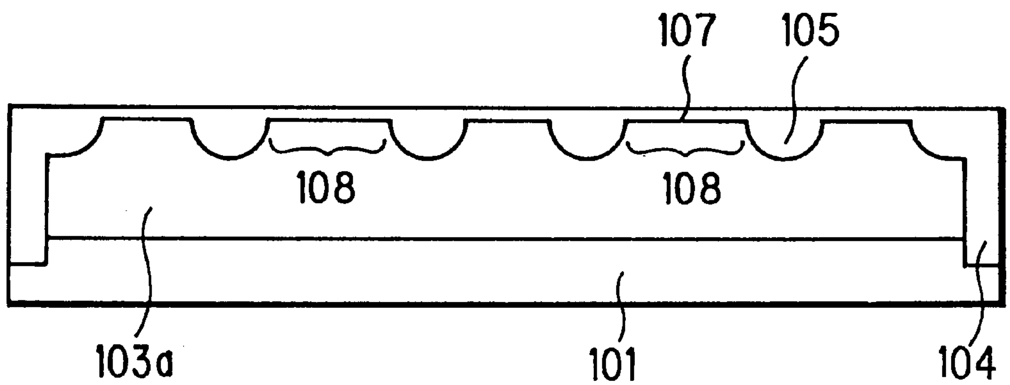
FIG. 10A is another sectional view for illustrating fabrication processes of the multi-emitter bipolar transistor of FIG. 8A.
Figure 10B:
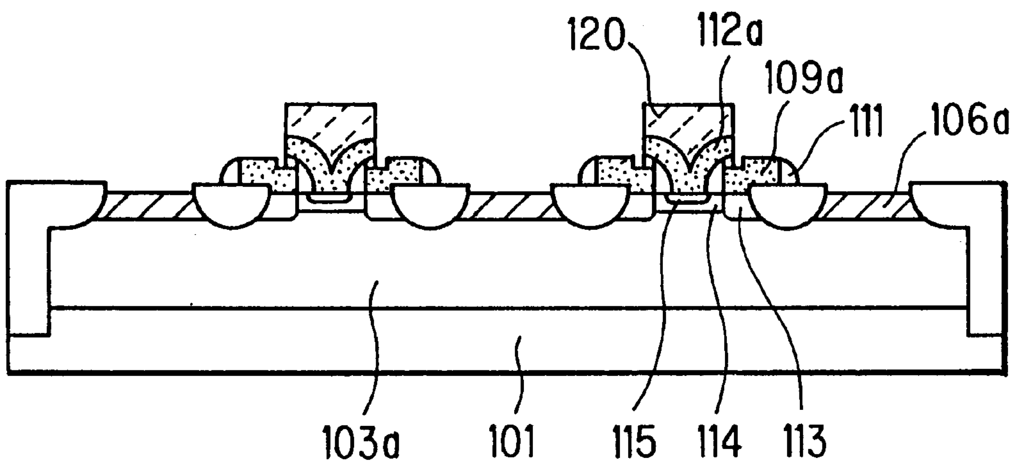
FIG. 10B is still another sectional view for illustrating fabrication processes of the multi-emitter bipolar transistor of FIG. 8A.

Now, fabrication processes of the multi-emitter bipolar transistor of the fifth embodiment is described referring to FIGS. 10A to 10B.

Referring to FIG. 10A, the collector region 103*a* is formed in a p-type Si substrate 101 by implanting P-ions of a dose amount of $5\times10^{13}$ to $5\times10^{14}$ with implantation energy of 500 KeV to 2 MeV. Then, wide and shallow trenches are formed so as not to attain to the bottom of the collector region 103*a*, for dividing emitter/base formation regions 108 and collector leading region 106*a* to be formed. Then, narrow and deep trenches of 0.4 $\mu$m to 2 $\mu$m width are formed so as to penetrate through the collector region 103*a* for sectioning a transistor formation region. By entirely filling the shallow and the deep trenches with insulation material such as an oxide film, a first and a second element-isolation film 104 and 105 are formed. Then, a first insulation film 107 of 5 to 30 nm thickness is formed by way of a thermal-oxidation method, for example.

Then, as shown in FIG. 10B, after partially removing the first insulation film 107 on the emitter/base formation regions 108 making use a photo-resist, mask, for example, a poly-Si films having 10 to 40 nm thickness and doped into p-type are formed overall, through growth and ion-implantation or through deposition making use of a growth vapor added with impurities. Then, after covering the poly-Si film with a second insulation film 110 formed with an oxide or nitride film of 5 to 20 nm, the poly-Si film is masked with photo-resist, for example, and etched back through anisotropic etching in order to from base leading poly-Si layers 109a shaped in strips each having an emitter opening 108*a* at its center part.

Then, intrinsic and extrinsic base regions 114 and 113 are formed a through ion-implantation of B or $BF_2$, or introduction of impurities through thermal diffusion from a gas. After forming the intrinsic base regions 114, a third insulation film 111 is formed and etched back by anisotropic etching for configuring side walls of the base leading poly-Si layer 109*a*. Then, $n^+$ doped poly-Si film of 10 to 40 nm is formed through growth and ion-implantation, or deposition making use of a growth gas including impurities, which is masked with a photo-resist pattern 120 and processed by anisotropic etching for forming emitter leading poly-Si layers 112*a*. Then, the first insulation film 107 on the collector leading regions 106 is selectively removed by anisotropic etching using a photo-resist mask.

Then, Ti or Co of 10 to 50 nm thickness is depositted by sputtering, for example, and made to react with Si in a nitrogen or argon-nitrogen atmosphere into a silicide film, whereof useless parts are removed for forming a base leading silicide layer 109*b*, collector leading silicide layers 116 and emitter leading silicide layers 112*b* on surfaces of the base leading poly-Si layer 109*a*, collector leading regions 106 and the emitter leading poly-Si layers 112*a*, respectively.

Then, an inter-layer insulation film 117 having a lamination of an oxide film and another oxide film including B and P is formed and contact plugs 118*a* to 118*c* including barrier metal are formed after digging contact holes at necessary positions of the inter-layer insulation film 117. Finally, a metal film of Al or Cu is formed and patterned by anisotropic etching for providing collector wirings 119*a*, emitter wirings 119b and base wirings 119*c*.

Thus, the multi-emitter bipolar transistor of FIGS. 9A and 9B of the fifth embodiment is fabricated.

As heretofore described, in a self-align type bipolar transistor having a multi-emitter structure included in a semiconductor device according to the invention, more than one emitter/base formation regions and at least one collector leading region are arranged in a single array, and extrinsic base regions are connected to at least one base electrode having a contact plug provided outside of the single array by way of a base leading electrode. Therefore, collector-base isolation lengths call be set to be a minimum length determined by a collector-base breakdown voltage, enabling to minimize the collector resistance, the collector-base capacitance and the collector-substrate capacitance, as well as to minimize the element size of the bipolar transistor.

Figure 12A:
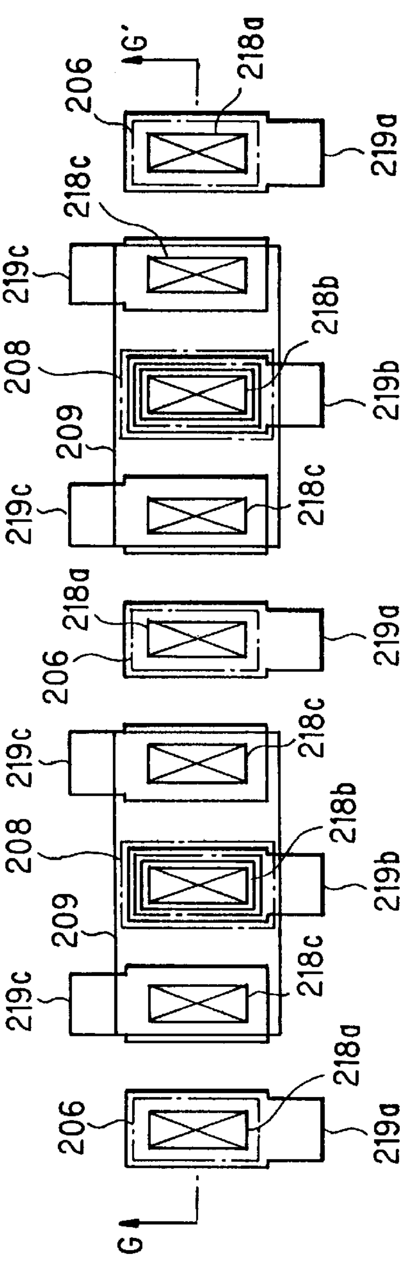
FIG. 12A illustrates a plan layout of a multi-emitter bipolar transistor of a second conventional example.
Figure 12B:
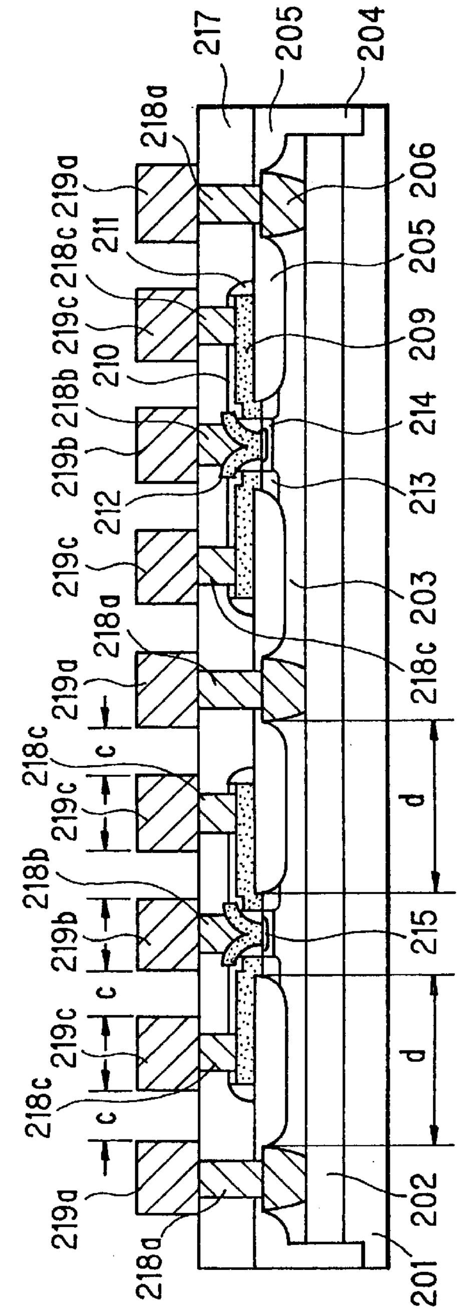
FIG. 12B is a sectional view of the bipolar transistor of FIG. 12A cut along a line G–G'.
Figure 13A:
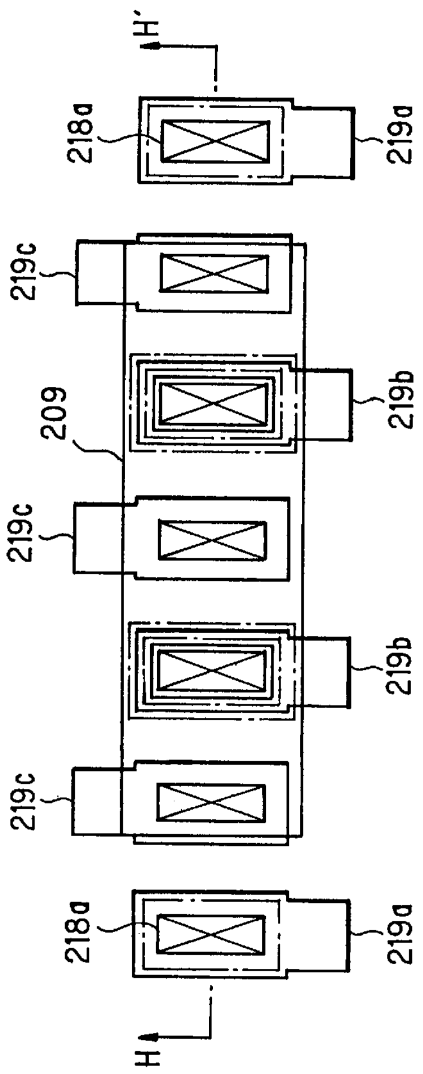
FIG. 13A illustrates a plan layout of a multi-emitter bipolar transistor of a third conventional example.
Figure 13B:
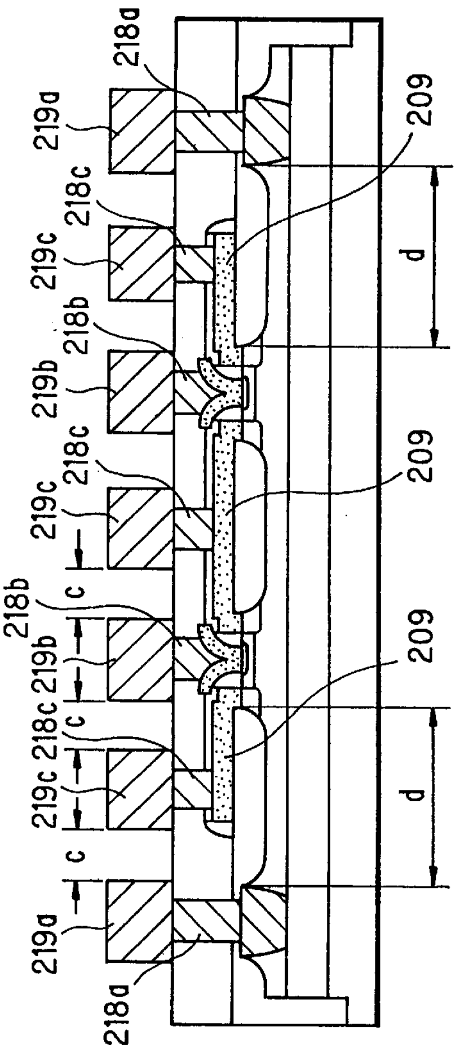
FIG. 13B is a sectional view of the bipolar transistor of FIG. 13A cut along a line H–H'.

According to concrete examples of the invention, the collector resistance, the collector-base capacitance and the collector-substrate capacitance can be reduced by 5 to 10%, about 10% and 35 to 45%, respectively, compared to a conventional example such as illustrated in FIGS. 12A and 12B.

What is claimed is:

1. A semiconductor device including a bipolar transistor of a self-align type having a multi-emitter structure, the bipolar transistor comprising;

a collector region of a first conductive type formed on a semiconductor substrate, at least one collector leading region formed in the collector region, more than one emitter/base formation regions formed on the collector region, an element isolation film formed on the collector region having openings on said at least one collector leading region and said more than one emitter/base formation regions, base regions of a second conductive type each formed in a surface region of the collector region in respective one of said more than one emitter/base formation regions, at least one base leading electrode formed on the element-isolation film, extending on each of said more than one emitter/base formation regions to contact with a periphery of respective one of the base regions and having an opening on a center part of respective one of said more than one emitter/base formation regions, emitter diffusion layers each formed on a center surface of respective one of the base regions, emitter leading electrodes each formed on a surface of respective one of the emitter diffusion layers to be in contact with the surface and isolated from said at least one base leading electrode, an inter-layer insulation film covering the element-isolation film, said at least one collector leading region, said at least one base leading electrode and the emitter leading electrodes, and having contact holes each penetrating through the inter-layer insulation film and being provided on respective one of said at least one collector leading region, said at least one base leading electrode and the emitter leading electrodes, and wirings each extending on the inter-layer insulation film and connected to respective one of said at least one collector leading region, said at least one base leading electrode and the emitter leading electrodes by way of respective one of the contact holes;

wherein:

said more than one emitter/base formation regions and said at least one collector leading region are arranged in a single array;

each of said at least one base leading electrode is extending outside of the single array to be connected to respective one of the wirings by way of respective one of the contact holes formed outside the single array.

2. A semiconductor device as recited in claim 1; wherein at least a of said at least one base leading electrode is formed of a lamination lower poly-crystalline silicon layer and an upper silicide layer.

3. A semiconductor device as recited in claim 1; wherein one of at least one collector leading regions is arranged between two of more than one emitter/base formation regions in the single array.

4. A semiconductor device as recited in claim 1; wherein one of said at least one collector leading regions is arranged at each end of the single array.

5. A semiconductor device as recited in claim 1; wherein one of said at least one base leading electrode is formed of a single conductive film extending over at least two of said more than one emitter/base formation regions and having an opening for each of said at least two of said more than one emitter/base formation regions.

6. A semiconductor device as recited in claim 1; wherein one of said at least one base leading electrode is formed of a single conductive film extending over at least two of said more than one emitter/base formation regions and having an opening provided for each of said at least two of said more than one emitter/base formation regions and certain of said at least one collector leading region being arranged among said at least two of said more than one emitter/base formation regions.

7. A semiconductor device as recited in claim 1; wherein one of the contact holes provided for said at least one base leading electrode is formed at a side of the single array.

8. A semiconductor device as recited in claim 1; wherein one of the contact holes provided for said at least one base leading electrode is formed adjoining to an end of the single array.

9. A semiconductor device as recited in claim 5; wherein:

said at least one base leading electrode is formed of the single conductive film; and only one of the contact holes is formed on the single conductive film.

* * * * *